US010469095B2

(12) United States Patent
Lin et al.

(10) Patent No.: US 10,469,095 B2
(45) Date of Patent: Nov. 5, 2019

(54) SUCCESSIVE APPROXIMATION REGISTER ANALOG-TO-DIGITAL CONVERTER, ELECTRONIC DEVICE AND METHOD THEREFOR

(71) Applicant: NXP B.V., Eindhoven (NL)

(72) Inventors: Yu Lin, Utrecht (NL); Erwin Janssen, Veldhoven (NL); Vladislav Dyachenko, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/119,117

(22) Filed: Aug. 31, 2018

(65) Prior Publication Data

US 2019/0149162 A1     May 16, 2019

(30) Foreign Application Priority Data

Nov. 14, 2017     (EP) .................................... 17201605

(51) Int. Cl.
*H03M 1/38*     (2006.01)
*H03M 1/18*     (2006.01)
(Continued)

(52) U.S. Cl.
CPC .............. *H03M 1/38* (2013.01); *G01S 13/06* (2013.01); *H03M 1/1004* (2013.01);
(Continued)

(58) Field of Classification Search
CPC .... H03M 1/38; H03M 1/1004; H03M 1/1028; G01S 13/06
(Continued)

(56) References Cited

U.S. PATENT DOCUMENTS 3,973,260 A     8/1976   Constantini et al.
7,605,741 B2   10/2009   Hurrell
(Continued)

OTHER PUBLICATIONS

Doerry, A.W., "Spurious effects of analog-to-digital conversion nonlinearities on radar range-Doppler maps", Defense & Security Symposium, SPIE 2015.
(Continued)

*Primary Examiner* — Khai M Nguyen

(57) ABSTRACT

A successive approximation register, SAR, analog-to-digital converter, ADC, (400) is described. The SAR ADC (400) includes: an analog input signal (410); an ADC core (414) configured to receive the analog input signal (410) and comprising: a digital to analog converter, DAC (430) located in a feedback path; and a SAR controller (418) configured to control an operation of the DAC (430), wherein the DAC (430) comprises a number of DAC cells, arranged to convert a digital code from the SAR controller (418) to an analog form; a digital signal reconstruction circuit (450) configured to convert the digital codes from the SAR controller (418) to a binary form; and an output coupled to the digital signal reconstruction circuit (450) and configured to provide a digital data output (460). The DAC (430) is configurable to support at least two mapping modes, including a small signal mapping mode of operation; and the SAR controller (418) is configured to identify when the received analog signal is a small signal level, and in response thereto re-configure the DAC (430) and the digital signal reconstruction circuit (450) to implement a small signal mapping mode of operation.

20 Claims, 12 Drawing Sheets

(51) Int. Cl.
G01S 13/06 (2006.01)
H03M 1/10 (2006.01)
H03M 1/46 (2006.01)

(52) U.S. Cl.
CPC ......... *H03M 1/1028* (2013.01); *H03M 1/181* (2013.01); *H03M 1/187* (2013.01); *H03M 1/462* (2013.01)

(58) Field of Classification Search
USPC .............................. 341/120, 161–163, 172
See application file for complete search history.

(56) References Cited

U.S. PATENT DOCUMENTS

| | | | | |
|---|---|---|---|---|
| 7,675,452 B2* | 3/2010 | Madhavan | ............ | H03M 1/068 341/155 |
| 8,542,141 B2* | 9/2013 | Yamase | ................ | H03M 1/462 341/155 |
| 8,587,466 B2* | 11/2013 | Debnath | ............... | H03M 1/145 341/155 |
| 9,143,153 B1 | 9/2015 | Tai et al. | | |
| 9,182,476 B2* | 11/2015 | Wintermantel | ......... | G01S 7/023 |
| 9,362,938 B2 | 6/2016 | Zare-Hoseini et al. | | |
| 9,547,071 B2* | 1/2017 | Vaucher | .................... | G01S 7/02 |

OTHER PUBLICATIONS

Fetterman, H., "CMOS Pipelined ADC Employing Dither to Improve Linearity"; Custom Integrated Circuits Conference, IEEE 1999.

Galton, I., "Why Dynamic-Element-Matching DACs Work", IEEE Transactions on Circuits and Systems—II: Express Briefs, vol. 57, No. 2, Feb. 2010.

Harpe, P., "A 2.2/2. 71J/conversion-step 10/12b 40kS/s SAR ADC with Data-Driven Noise Reduction", Session 15, Data Converter Techniques 15/2, ISSCC 2013.

Huang, G., "A 1-uW 1-bit 200-kS/s SAR ADC With a Bypass Window for Biomedical Applications", IEEE Journal of Solid-State Circuits, vol. 47, No. 11, Nov. 2012.

Lee, C., "A 12b 700MS/s SAR ADC with Digital Startup Calibration in 14nm CMOS", Symposium on VLSI Circuits Digest of Technical Papers, 2015.

Lee, H., "A Self-Calibrating 15 Bit CMOS A/D Converter", IEEE Journal of Solid-State Circuits, vol. SC-19, No. 6, Dec. 1984.

Shu, Y., "An Oversampling SAR ADC with DAC Mismatch Error Shaping Achieving 105dB SFDR and 101dB SNDR over 1kHz BW in 55nm CMOS", Session 27, Hybrid and Nyquist Data Converters, 27.2, ISSCC 2016.

Thirunakkarasu, S., "Built-in Self-Calibration and Digital-Trim Technique for 14-Bit SAR ADCs Achieving ±1 LSB INL", IEEE Transactions on Very Large Scale Integration (VLSI) Systems, vol. 23, No. 5, May 2015.

* cited by examiner

SUCCESSIVE APPROXIMATION REGISTER ANALOG-TO-DIGITAL CONVERTER, ELECTRONIC DEVICE AND METHOD THEREFOR

CROSS-REFERENCE TO RELATED APPLICATIONS

This application claims the priority under 35 U.S.C. § 119 of European Patent application no. 17201605.7, filed on 14 Nov. 2017, the contents of which are incorporated by reference herein.

FIELD OF THE INVENTION

The field of the invention relates to a successive approximation register (SAR) analog-to-digital converter (ADC), an electronic device and method for improving a linearity performance thereof.

The invention is applicable to, but not limited to, a SAR ADC for a device such as a radar unit.

BACKGROUND OF THE INVENTION

In a radar system, it is known that the signal level of received signals may vary across a large dynamic range. In order to avoid false alarms and missing detection, an extraordinarily linear receiver is required in order to reliably detect weak reflection signals that are received barely above the receiver noise level (e.g. from targets with a small cross section and/or that are relatively far away such that the echo signal is returned at a very low level). A problem exists when these weak reflection signals coexist with other strong reflection signals (e.g. from nearby pedestrians mixed with nearby vehicles, say in an urban area).

When receiving strong echo/reflection signals, the radar receiver channel linearity is normally limited by the non-linearity of millimetre (mm)Wave/radio frequency (RF) front-end circuits of the radar unit; whilst for weak reflection signals it is limited by the analog-to-digital converters' (ADC's) performance at being able to identify a small received signal (say from a distal object) from amongst one or more much larger received signals. The ADCs for high performance automotive radar sensors (sometimes referred to as radar units) are required to have ultra-low spurs levels (e.g. below −90 dBFS or even −100 dBFS) together with a wide bandwidth, low noise, low power and low latency under wide operation conditions. Designing such an ADC in order to meet such stringent small signal linearity requirements is a challenging task.

In contrast to linear amplifiers, harmonic distortions introduced by the static linearity errors (differential nonlinearity (DNL)/integral nonlinearity (INL)) of Nyquist-rate ADCs do not scale down as input signal amplitude decreases; instead it is recognised that they can stay at a similar level, noting that DNL is the differential nonlinearity and is defined by the deviation between the difference between an actual step width and the ideal value of '1' LSB, whilst INL is the integral nonlinearity and is defined by the deviation of the actual ADC transfer function from the ideal one.

Referring now to FIG. 1, a known signal diagram 100 illustrates a strong input signal 112 and a weak input signal 114 of an input analog signal 110 being provided to an ADC. The ADC converts the input analog signal 110 to a range of digital output reference values 120, say for signal processing in a radar unit. As shown, only a small number 122 of digital output reference values 120 are available to describe the weak input signal 114. Consequently, the ADC conversion errors are known to have a strong signal level dependency, which leads to undesirable harmonic spurs that can cause false target detection.

The successive approximation register (SAR) ADC architecture is one of the most popular ADC architectures, as demonstrated in many publications, as the choice for achieving a good overall performance (e.g. wide bandwidth, low power, low latency). However, the small input signal linearity of the SAR ADC is limited due to the limitations presented above. FIG. 2 illustrates a known generic example block diagram of a SAR ADC 200, with operational phases and waveforms. The SAR ADC 200 includes an input 210 that is provided to a track-and-hold (T/H) circuit 214, and a sampled output provided to a comparator 216, and finally a SAR controller 218. A feedback path includes N-bit control signals 219 connected to the SAR controller 218 and a N-bit digital to analog converter (DAC) 220 arranged to convert the converted digital input signal to an analog form. A digital data output 230 is output from the SAR ADC 200 as a result of the comparator output and the determination by the SAR controller 218.

The operation of an SAR ADC 200 consists of two phases, which are repetitive as shown in 250 when the ADC is active. In a first sampling phase 260, the analog input signal is processed through the T/H circuit 214, which is normally a switched capacitor type circuit and the sampled signal ($V_{sampled}$) is held on a capacitor. Thus, when the switch transistor M1 211 turned on, the input analog signal is passed to a capacitor Cs 213 (the voltage across the capacitor follows the input signal), at the moment the switch transistor M1 211 is turned off, the signal amplitude value of this moment is stored across the capacitor Cs 213. This is also the so called tracking phase.

In a second SAR conversion phase 270, the SAR controller controls the DAC to generate an analog output signal ($V_{DAC}$) 280 in order to approximate the sampled signal ($V_{sample}$) 290 in each conversion cycle. The amplitude 252 difference of the sampled signal ($V_{sample}$) 290 and the DAC output signal ($V_{DAC}$) 280 is then amplified and compared by a comparator. The comparison and approximation are done sequentially over a number of cycles. At the end of the conversion phase, the DAC output signal ($V_{DAC}$) 280 approximates the sampled signal ($V_{sample}$) 290 with a maximum deviation of $V_{LSB}/2$ ideally. The output digital codes ($D_{out}$) represent the sampled analog signal.

The output of the N-bit DAC 220 is an analog signal expressed by:

$$V_{DAC}[i] = \sum_{i=1}^{N_C} d[N_C - i] \cdot \text{weights\_a}[N_C - i] \quad [1]$$

Where: d[i] denotes the comparator decision with $\{-1, 1\}$ at the i-th conversion step,
$N_C$ the total number of conversion cycles, and
weight_a[i] denotes the actual weights of the DAC cells (note: the weights are the ratio of values of DAC cells to that of the least significant bit (LSB) DAC cell).

In a conventional SAR conversion, the DAC cells are switched one by one, in sequence, from the largest DAC cell to the smallest DAC cell, in order to approximate the sampled signal successively.

The ADC digital output codes can be expressed by:

$$D_{out}[i] = \sum_{i=1}^{N_C} d[N_C - i] \cdot \text{weights\_d}[N_C - i] \quad [2]$$

Where: weight_d[i] denotes the weights used by the ADC 200 for reconstructing the digital representation of the sampled analog signal.

Ideally, the values of weight_d should be exactly the same as weight_a. However, due to the mismatch of components (transistors, capacitors, or resistors, etc.) that are used to implement DAC cells in the N-bit DAC 220, the weights used in the digital domain can deviate from the actual weights of the DAC cells. This results in DNL/INL errors that cause unwanted harmonic spurs. This error mechanism is the main source of small signal nonlinearity in Nyquist-rate ADCs.

Many published works use predefined DAC cell weights (e.g. weight_d[0: $N_C$−1]=1, 2, 4, 8, . . . , 2^($N_c$−1)) in order to reconstruct the ADC output signal, and rely on the intrinsic matching of devices to exhibit a relatively small difference between weight_d and weight_a. A major drawback of this approach is that large components' size is needed to reduce mismatches. In order to meet the ultra-low spurs level requirement for small signals, this approach can result in an unrealistic large component size and degradation of ADC conversion speed due to the accompanied large parasitic capacitors.

There are also a number of known approaches that exploit calibration methods in order to reduce weight deviation between weight_d and weight_a, instead of relying on the intrinsic matching accuracy of DAC cells. The advantage of these calibration approaches includes a reduction of silicon area and no compromise in the ADC conversion speed at the expense of addition design complexity. In a calibration phase, the actual weight values of DAC cells are measured and stored. Instead of using weight_d, the measured DAC cells weights (weight_mea) are used to map the non-binary ADC output digital codes ($D_{out}$) to binary codes during normal operation. The errors introduced during reconstruction in the digital domain are now determined by the weight measurement accuracy (the differences between weight_mea and weight_a) in the calibration process.

However, the resulting performance from a use of calibration techniques can vary significantly. This is because the measurement and/or correction can be affected by the non-idealities of analog circuits that are involved in the calibration. The limitations for reliably achieving the ultra-low spurs level requirement for converting weak input signals include the weight value measurement accuracy being affected by noise (e.g. thermal, flicker, impulse noise), supply disturbances, crosstalk, settling, offset, and so on. Furthermore, the measurement procedure of DAC cells may be iterative (i.e. using the measured values of smaller sources to measure larger ones). Thus, errors in the measurement of small sources will propagate to the larger ones (e.g. to have 0.01% measurement accuracy in the MSB DAC cell, smaller DAC cells should have better than 0.01% measurement accuracy). Additionally, the actual weight values can vary during operation due to temperature and supply voltages drift, this can cause significant deviation from the weight values obtained in the start-up measurement (simulations have shown that this could cause over 10 dB variation in small signal linearity).

Dynamic Element Matching (DEM), dither and mismatch error shaping are popular techniques for mitigating the DAC cell mismatch problem. DEM and dither randomize DAC mismatch errors and reduce spurs at the expense of additional complexity, DEM requires complicated encoders and degrades normal operation speed, whilst the introduction of dither reduces the useful input range of the ADC. Other techniques propose DAC mismatch error shaping for oversampling SAR ADCs in order to achieve very high linearity without calibration. However, this technique requires a large oversampling factor, which greatly reduces the useful input signal bandwidth.

Thus, the inventors have identified and appreciated a number of problem areas in the use of SAR ADCs. First, the inventors have identified that mismatches between weight coefficients used for mapping the digital codes and the actual DAC cells weights lead to unwanted spurs, and limit the small signal linearity of the ADC. Secondly, switching of the first few large DAC cells is in fact redundant for small sampled signal, however, the weight deviation of the larger DAC cells still affect the output signal linearity and it is a dominant factor.

Thus, a mechanism is needed to improve SAR ADC performance, for example within a radar unit.

SUMMARY OF THE INVENTION

The present invention provides a successive approximation register (SAR) analog-to-digital converter (ADC), an electronic device and method for improving a linearity performance thereof, as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Figure 1:
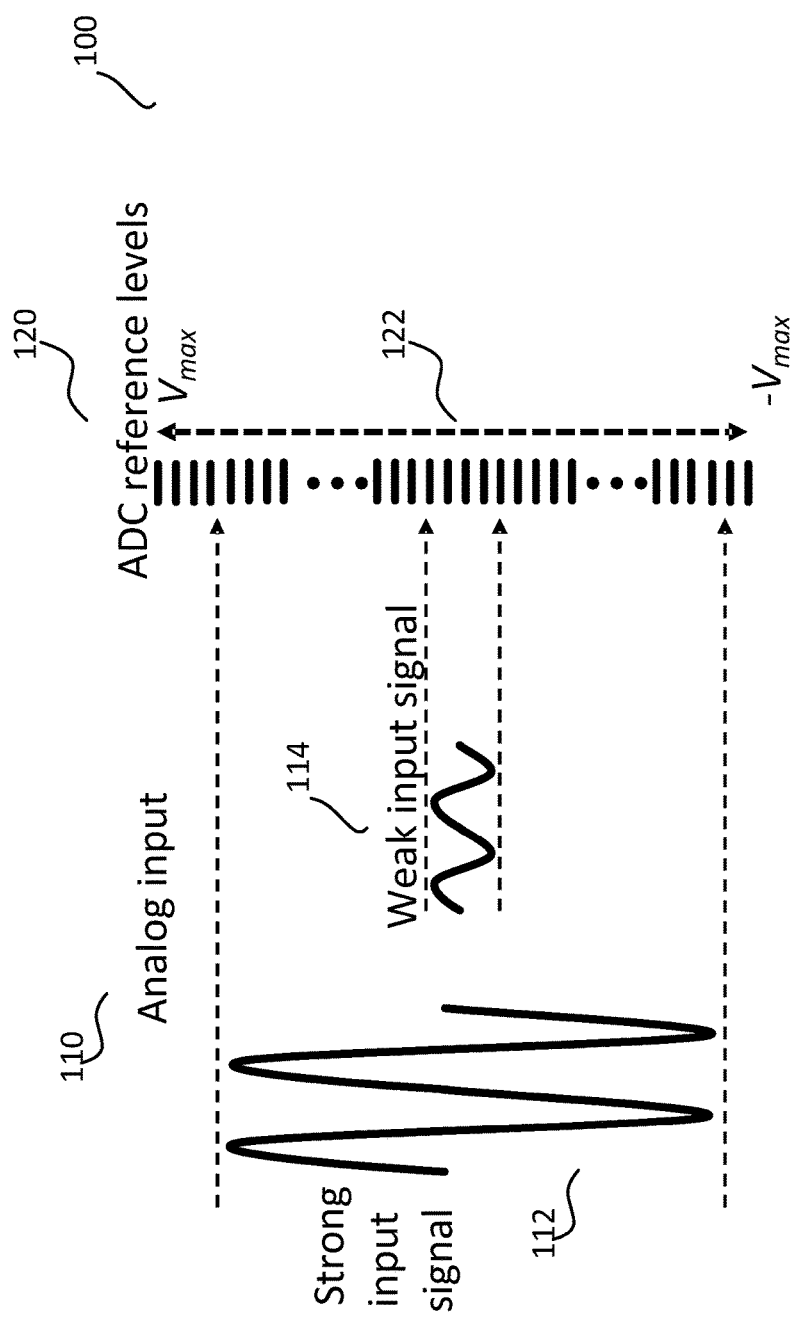
FIG. 1 illustrates a known signal diagram of strong and weak signals, which are mapped to an ADC input range, say for a radar unit.

Because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Differential nonlinearity (DNL)/integral nonlinearity (INL) errors due to mismatch of DAC cells in a SAR ADC are the main source of harmonic spurs for converting small signals. So far, known methods have been exploited to improve matching, e.g. by using larger size components or calibration. However, some DNL errors will inevitably remain, and therefore degrade the ADC linearity. The inventors of the present invention have recognized and appreciated that it would be advantageous to develop a SAR ADC design, for example for a radar unit, with an ultra-low spur level, especially to accommodate weak input signals.

Therefore, examples of the invention describe an ADC architecture that provides an improved performance over conventional SAR ADC architecture in terms of small signal linearity. In particular, a mechanism is described that can identify small signal levels of the input analog signal and adapt the conversion scheme and the output digital code mapping in response thereto. In some examples, the identification of small signal levels, results in a portion of a conversion step (or phase) being skipped. In this manner, the SAR ADC examples are designed to be insensitive to mismatches of MSB DAC cells (the first few larger cells) in improving small signal linearity. Besides greatly enhancing the small signal linearity of the ADC, the proposed SAR ADC provides an additional benefit in improving a signal-to-noise ratio (SNR) performance of the ADC for weak signals, without comprising speed. In addition, the SAR ADC according to examples of the invention exhibits improved insensitivity to DNL errors introduced by MSB DAC sources, which the inventors have determined as dominating the spurs level for small input signals.

A successive approximation register, SAR, analog-to-digital converter, ADC, and an electronic device, such as a radar unit and a method are described. The SAR ADC includes: an analog input signal; an ADC core configured to receive the analog input signal and comprising: a digital to analog converter, DAC located in a feedback path; and a SAR controller configured to control an operation of the DAC. The DAC comprises a number of DAC cells, arranged to convert a digital code from the SAR controller to an analog form. A digital signal reconstruction circuit is configured to convert the digital codes from the SAR controller to a binary form. An output is coupled to the digital signal reconstruction circuit and configured to provide a digital data output. The DAC is configurable to support at least two mapping modes, including a small signal mapping mode of operation; and the SAR controller is configured to identify when the received analog signal is a small signal level, and in response thereto re-configure the DAC and the digital signal reconstruction circuit to implement a small signal mapping mode of operation.

In some examples, the SAR ADC may be configured to operate in a time multiplexed manner and the SAR controller may be configured to analyse a first chirp in one chirp sequence of a received signal in order to detect a signal strength of the sampled analog input signal and to use this information for converting subsequent chirps.

In some examples, an auxiliary signal level detection path may be included that comprises a signal level range detector circuit coupled to the multiplexer and the SAR controller and arranged to determine a signal strength of the sampled analog input signal, and in response thereto inform the SAR controller and the digital signal reconstruction circuit. In some examples, the SAR controller may be configured to adaptively set one or more threshold(s) applied by the signal level range detector circuit to influence when the small signal mapping mode of operation is adopted by the DAC and the digital signal reconstruction circuit.

In some examples, an adaptive SAR ADC conversion scheme is employed, whereby an adaptive and/or programmable threshold is used to influence whether a small signal level conversion scheme is employed, for example to enhance a small signal linearity performance of the SAR ADC. In some examples, the adaptive SAR ADC conversion scheme may be based on the sampled signal strength, for example realized by an auxiliary detection circuit that compares the sampled signal level against one or multiple of predefined reference levels. The obtained information on the signal level may dictate how the DAC is controlled, noting that the DAC is typically composed of many DAC units (with their values being binary scaled for example), each one can be configured by three states to output three levels ($-1*weight\_bit[n]$, $0.1*weight\_bit[n]$), and the combination of all these units' output value can then be used to create a multi-level analog output waveform. In this manner, the small signal linearity limitation posed by mismatch errors of the larger DAC cells in SAR ADCs may be avoided. In particular, the proposed architecture and operation may provide a useful technique for any SAR ADC, as it may reduce the switching energy in case the DAC is a switched capacitor type. Although examples of the invention find particular applicability, and are described with reference to, in systems, such as radar systems, that demand high linearity for a small input signal, it is envisaged that the concepts herein described may be applied to any electronic device that utilises an SAR ADC.

Figure 3:
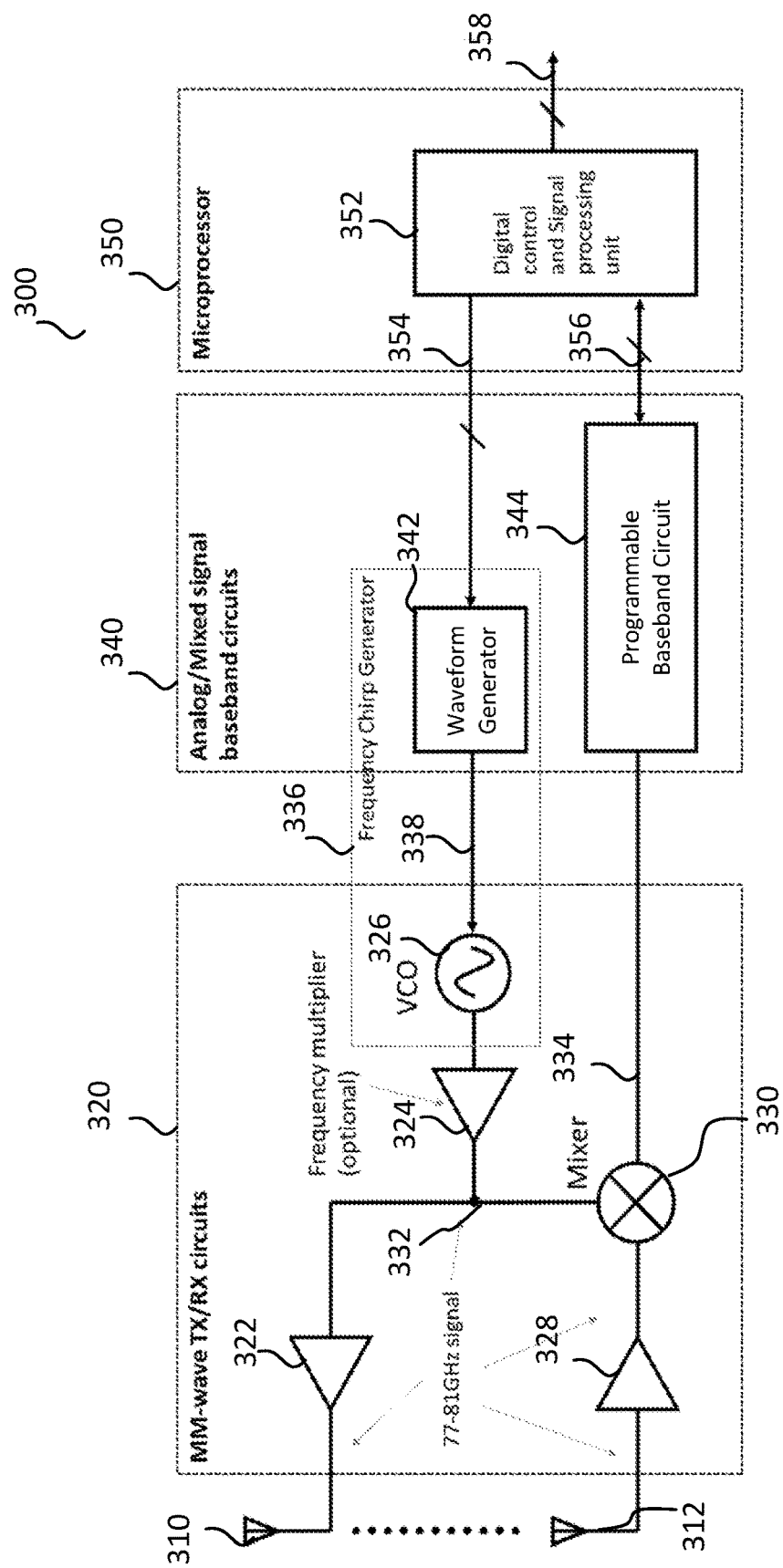
FIG. 3 illustrates an example block diagram of an electronic device, in a form of a radar unit, adapted according to example embodiments of the invention.

Referring now to FIG. 3, a block diagram illustrates an example electronic device, in a form of a frequency modulated continuous wave (FMCW) radar unit 300, adapted according to examples of the invention. The FMCW radar unit 300 includes one or more transmitter antenna(e) 310 and one or more receiver antenna(e) 312 and one or more transceivers (for example multiple transceivers in an application of a MIMO or phase array radar) and corresponding signal processing units. The radar functions with multiple separate ICs include, e.g., a mmW transceiver (TxRx) circuit 320, an analog/mixed signal baseband circuit 340 and a microprocessor IC 350. In a transmitter sense, the microprocessor IC 350 includes a digital control and signal processing unit 352 that provides a transmit radar signal 354 to a frequency chirp generator circuit that includes a waveform generator 342 in the analog/mixed signal baseband circuit 340. The waveform generator 342 provides a signal 338 that is to be modulated to a voltage controlled oscillator (VCO) circuit 326. The modulated signal is then optionally passed to a frequency multiplier 324 (if the VCO generated signal is not at the operating frequency of the FMCW radar sensor 300). The high-frequency output 332 of the VCO 326 or the frequency multiplier 324 is passed to a power amplifier 322, where it is amplified and routed to the one or more transmitter antenna(e) 310.

A radar signal is received at the one or more receiver antenna(e) 312 and passed to a low noise amplifier (LNA) 328 where it is amplified. The amplified received radar signal is passed to a down-mixer 330, where it is mixed with the high-frequency signal 332 output from the VCO 326. The down-converted received radar signal 334 from down-mixer 330 is input to a programmable baseband circuit 344 that includes a bandpass filter and one or more gain amplifiers, as well as an SAR ADC adapted according to examples of the invention. The improved SAR ADC is illustrated in, and described with reference to, subsequent figures. The digital output 356 from the programmable baseband circuit 344 is input to the digital control and signal processing unit 352 for processing and the received processed radar signal 358 is output.

Figure 4:
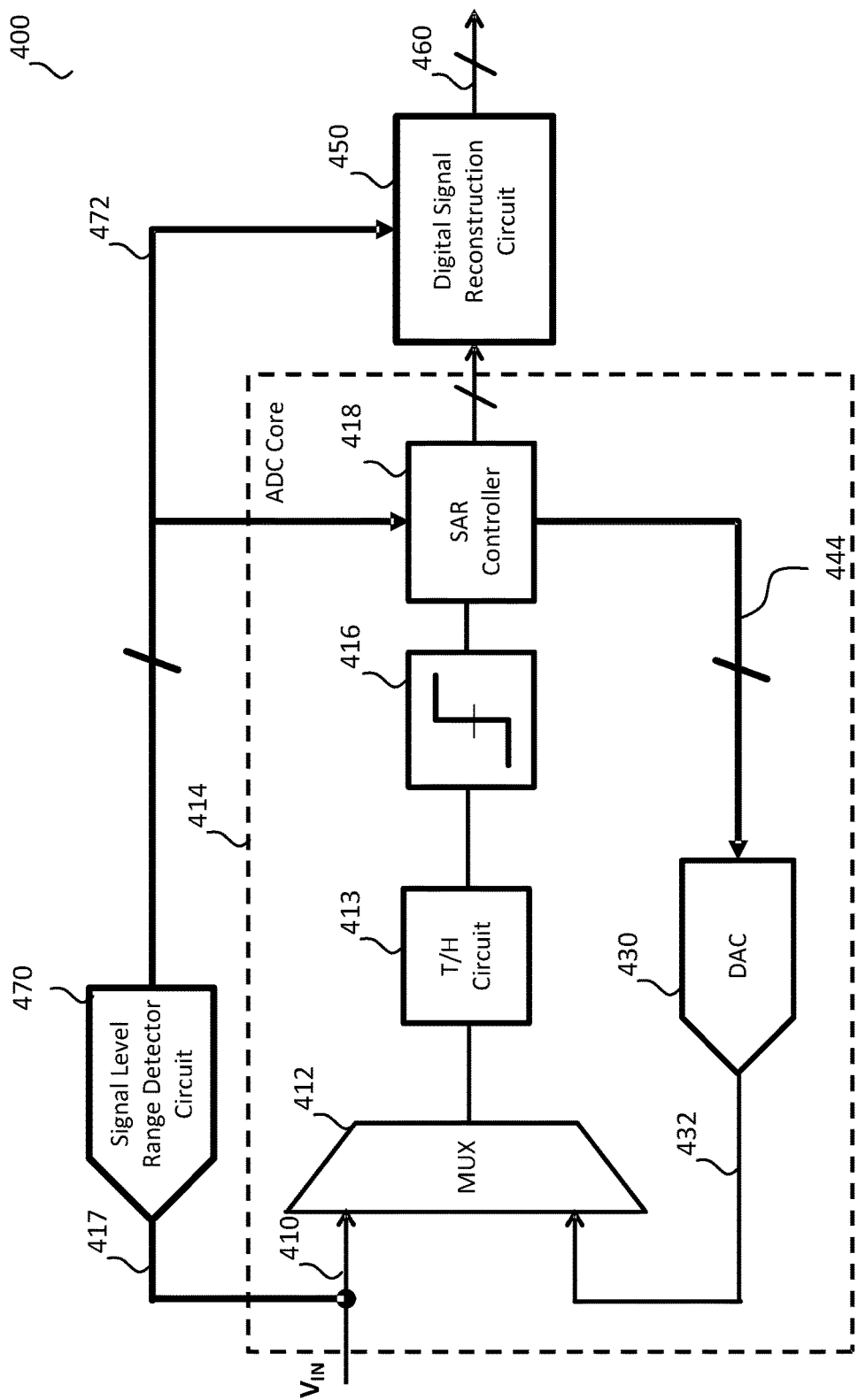
FIG. 4 illustrates an example block diagram of a SAR ADC, for example implemented in the radar unit of FIG. 3, according to example embodiments of the invention.

Referring now to FIG. 4, an example block diagram of a SAR ADC 400, for example implemented in the programmable baseband circuit 344 of radar unit 300 of FIG. 3, is illustrated according to example embodiments of the invention. The SAR ADC 400 includes an input 410 to an ADC core 414, which in this example contains a multiplexer 412 coupled to a track-and-hold (T/H) circuit 413.

In this example, the ADC core 414 of the SAR ADC 400 also includes a comparator circuit 416, SAR controller 418 and a digital-to-analog converter (DAC) 430 in a feedback path to provide a DAC output 432 to the multiplexer 412. The multiplexer 412 contains multiple switches to connect the input or the DAC output 432 to the T/H circuit 413. In some examples, the function of the T/H circuit 413 and the DAC 430 may be implemented in one circuit block, as shown, or can be implemented in different circuits, dependent upon design or implementation factors.

In some examples, it is envisaged that the function of the T/H circuit 413 and DAC 430 may be realized by, for example, by two independent circuit blocks or in alternative examples that these two functions may be combined in one circuit block. In some examples it is envisaged that the DAC 430 may be implemented using a current-steering DAC or switched-capacitor-based DAC or resistor-based DAC. It is envisaged that in other examples, other ADC architectures and circuit arrangements may be used. Thus, it is envisaged that the ADC core 414 of the SAR ADC 400 may take a number of forms, dependent upon the implementation.

Thereafter, the comparator circuit 416 is configured to receive the difference of the sampled signal and the DAC output signal ($V_{sampled}$-$V_{DAC}$), amplify this difference (a so-called 'residue signal') and compare it with one or more threshold levels (not shown). The comparator outputs a decision signal with two states that can be represented by (0, 1) at every clock cycle to indicate the sign of the signal that is present at its inputs (in this case is the sign of $V_{sampled}$-$V_{DAC}$). In a normal operation, one comparator decision corresponds to one DAC cell switching event.

The output from the comparator circuit 416 is input to SAR controller 418. A feedback path 422 from the SAR controller 418 includes DAC control signals, which are used to control the DAC 430 to update its output value to reduce the difference ($V_{sampled}$-$V_{DAC}$). The DAC control signals are updated one after another, in sequence, and they correspond to the comparator decisions, noting that the comparator 416 outputs N decisions in sequence as well. The output of the SAR controller is input to a digital signal reconstruction circuit 450 to provide a digital output signal 460.

Figure 2:
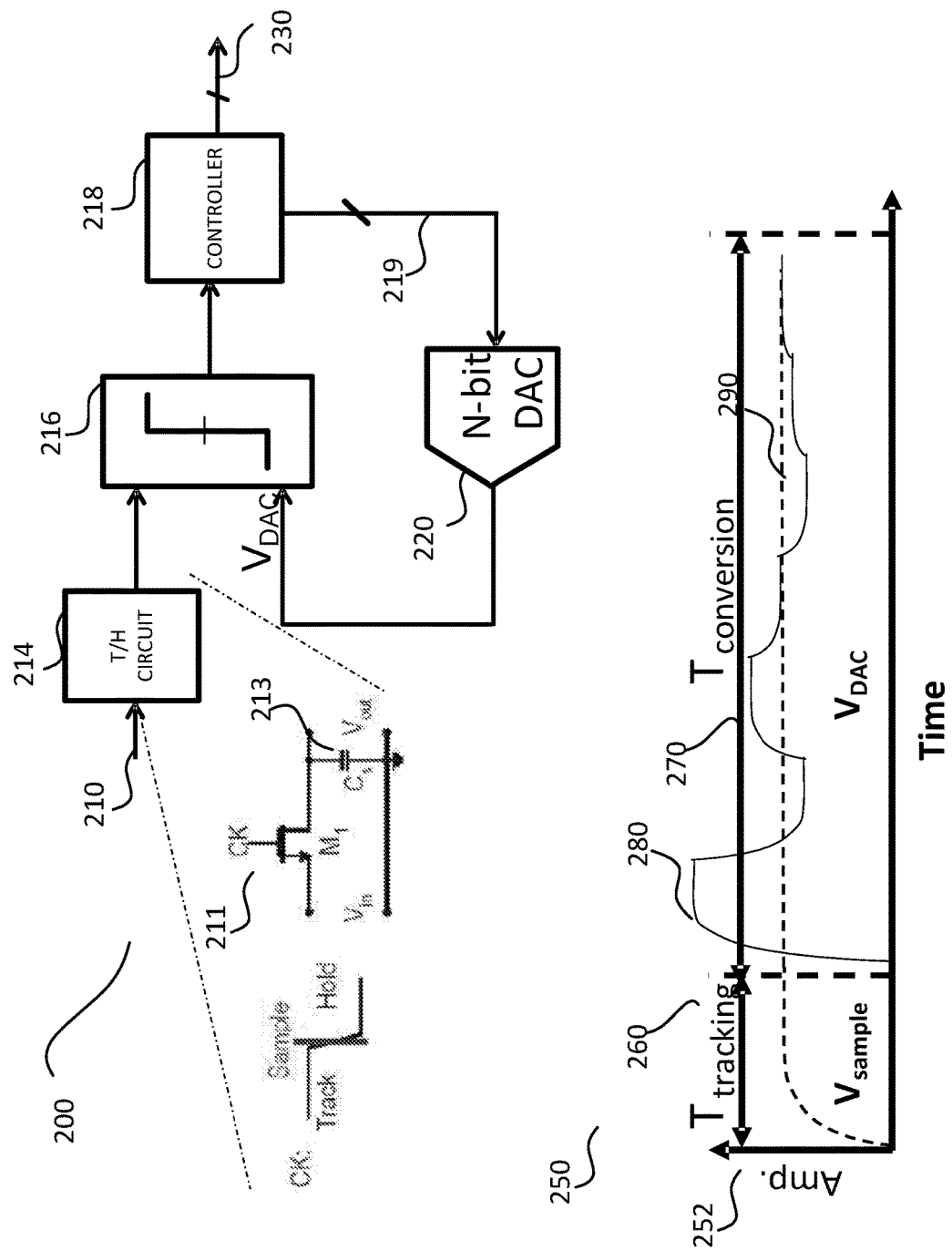
FIG. 2 illustrates a known generic block diagram of a SAR ADC, with operational phases and waveforms.

The operation procedure of a conventional SAR ADC, such as SAR ADC 200 in FIG. 2, is as follows: when the conversion phase starts, the comparator is activated to make a first decision (based on whether the sampled input signal value Vsample larger or smaller than zero), for example, this decision is recorded as d[$N_c$-1] and the MSB DAC cell is controlled accordingly to output a value of d[$N_c$-1] *weights_a[$N_c$-1] which is the VDAC. Then the difference of the Vsample-VDAC will be compared again and the comparator decision is recorded as d[$N_c$-2] and the SAR controller outputs the control signal for the MSB-1 DAC cell, the value of the output of the DAC VDAC is again updated. This procedure is continued until d[0]; after that the SAR controller outputs all d[$N_c$-1:0] to a digital signal reconstruction circuit. At the same time, before the tracking (or sampling) phase starts, all the DAC cells are reset, the conversion phase is now finished and the tracking phase starts again. The tracking phase and conversion phase are repeated one after the other during the operation of the SAR ADC.

Figure 6:
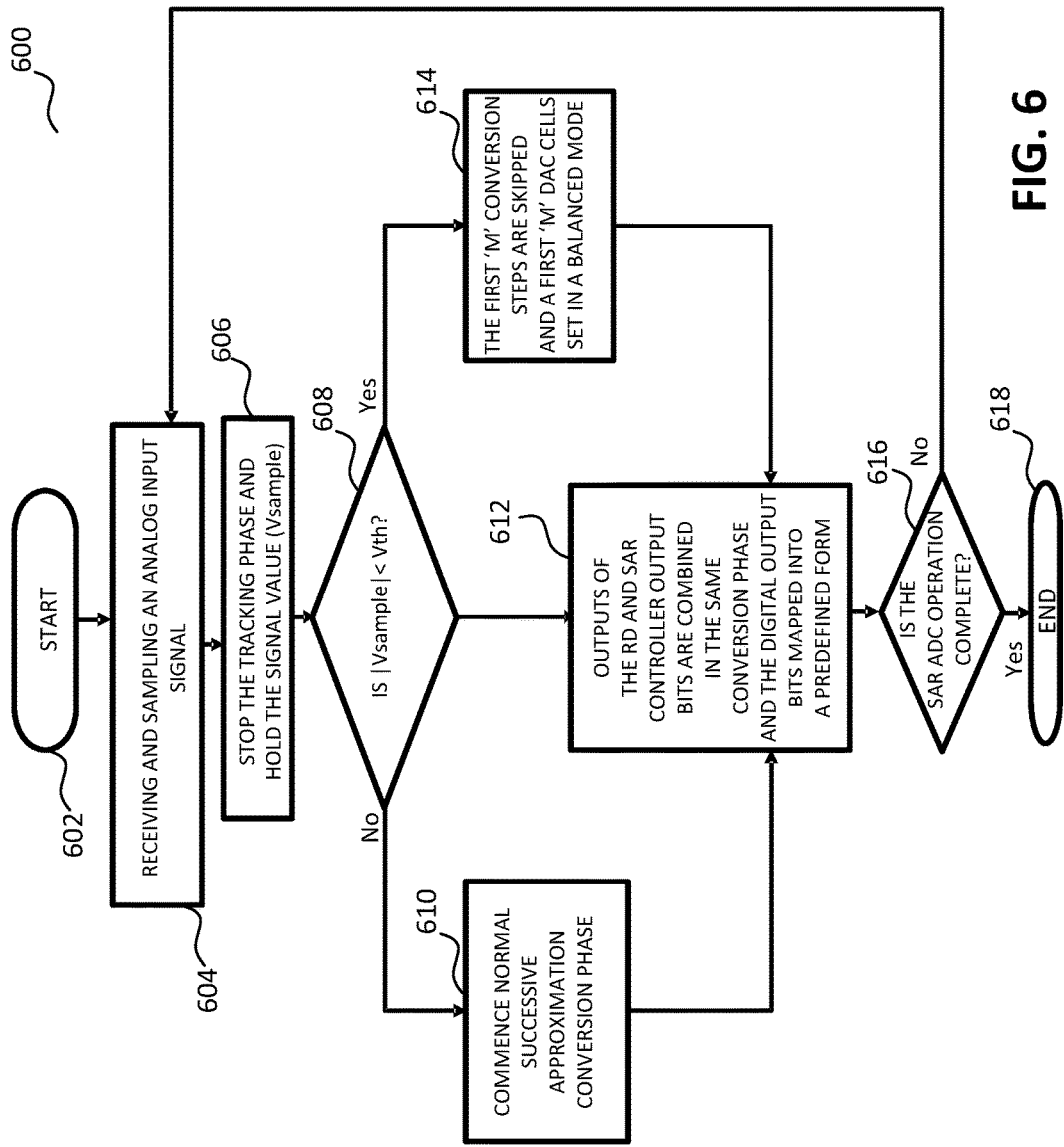
FIG. 6 illustrates an example flowchart of an improved SAR ADC, according to example embodiments of the invention.

In this example, SAR ADC 400 includes an auxiliary signal level detection path 417, which is introduced to compare the sampled signal level against predefined threshold levels (for example at least two levels). In some examples, this comparison may be performed at the beginning of the ADC conversion process (as illustrated in FIG. 6, e.g. straight after the tracking phase has finished). The auxiliary signal level detection path 417 feeds the switched analog input 410, to a signal level range detector circuit 470 that includes, for example one or more comparators and associated reference levels. The output from the range detector circuit 470 is input to the SAR logic 418, for example in a form of a SAR controller, as well as the digital signal reconstruction circuit 450.

The DAC 430 inside the SAR ADC 400 is controlled by a SAR controller 418 (or SAR logic) in order to generate an analog signal to compare against the sampled signal value during conversion phase. The DAC can be constructed using weighted current cells or switched capacitive type circuits, as known.

In operation, when small sampled signal levels are detected in the signal level range detector circuit 470 of the SAR ADC 400, the first 'M' conversion steps are skipped and a first 'M' DAC cells (MSB to MSB-M+1) set in a balanced mode. Thereafter, the conversion phase from a N-M step starts until the N-th step. The range detector 470 and the SAR controller 418 (modified) output bits are combined in the same conversion phase, and the digital output bits mapped into, say, a predefined form. In a case where the switching of M DAC cells is skipped, the comparator decision goes directly to control the M+1 DAC cell switching. In some examples, the DAC cells that are skipped are configured to output a zero differential output signal, and their corresponding weights stored in the digital domain are not used for the output signal reconstruction in digital signal reconstruction circuit 450. In this way, any signal reconstruction error that is introduced by weight measurement error of MSB DAC cells may be avoided and will not lead to spurs observed in ADC output signal spectrum.

The digital signal reconstruction circuit 450 is configured to map the digital output signal (Dout[i]) into a binary scaled digital data stream as shown in equation [1]. The d[i] can be −1, 0, or 1. If the DAC cells are not switching, it means the corresponding d[i] is 0.

$$D_{out}[i] = \sum_{i=1}^{N_C} d[N_C - i] \cdot \text{weights\_d}[N_C - i] \quad [1]$$

The range detection circuit 470 provides information on how many DAC cells (MSB, MSB−1, etc.) can be skipped switching (and therefore their corresponding digital control bits are to be represented by "0"). This information is provided to both the SAR controller 418 and the digital signal reconstruction circuit 450, as shown.

In contrast, for detected sampled large signal levels, the SAR ADC 400 operates in the same manner as a conventional SAR ADC. Thus, when the sampled signal level is small (e.g. below one or more thresholds, as determined by, say, signal level range detector circuit 470) the number of conversion steps in the conversion phase is reduced (e.g. the first one or more conversion steps may be skipped).

In some examples, this operation may also be performed by signal level range detector circuit 470. In such an example, the auxiliary signal level detection path 417 (which may include two or multiple of thresholds) may be configured to coarsely identify an amplitude/strength of the sampled signal. In some examples, this identification may be made in one short measurement, for example at the moment that the conversion phase starts. With this information, the SAR ADC 400 is able to start the conversion phase by searching in a smaller range, for example by controlling one or more DAC settings. For example, as the SAR ADC 400 is able to determine quickly that the received signal is smaller than a predefined threshold (e.g. between +/−VFS/30, where VFS is the full scale input range of the ADC), it is able to select a smaller range of conversion levels. Thus, in one example, the proposed small signal conversion operation of the example SAR ADC 400 occurs in the conversion phase, and does not affect the sampling phase. In some examples, the reference voltages, which are used to compare against the sampled signal value, may be adaptive, programmed to set different detection thresholds, etc.

Figure 5:
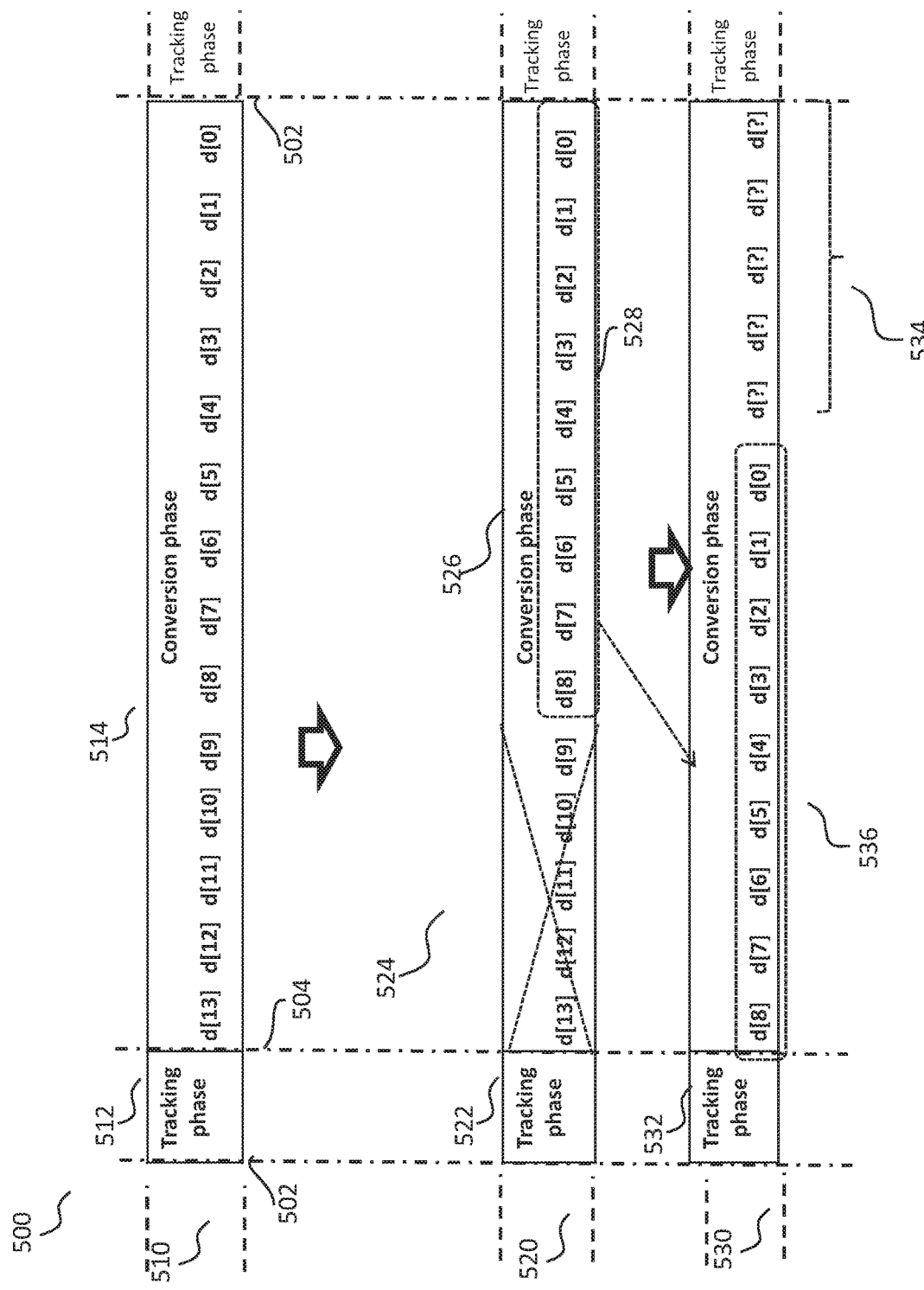
FIG. 5 illustrates a conventional SAR ADC conversion sequence, and an example data conversion sequence for the SAR ADC of FIG. 4, when converting small sampled signals according to example embodiments of the invention.

FIG. 5 illustrates an example data conversion sequence 500 for the SAR ADC when converting small sampled signals, according to example embodiments of the invention. A SAR conversion sequence 500 identifies time periods where the conversion is ready and a tracking phase starts 502, and the time when the tracking phase ends and the conversion phase starts 504.

A first SAR sequence 510 illustrates a conventional SAR conversion sequence having a first tracking phase 512 followed by a conversion phase 514. Notably, in the conventional approach, the SAR sequence 510 is the same for both large sampled signals and small sampled signals.

In contrast, according to examples of the invention, a second SAR conversion sequence 520 illustrates a first tracking phase 522 followed by a conversion phase 524 according to examples of the invention. In this example, after detecting a small signal level of the analog input signal, the first five most significant bit (MSB) digital outputs 526 after the conversion phase starts 504 are skipped, and the conversion phase 526 is carried out to search for the subsequent nine least significant bit (LSB) outputs 528. Although this example illustrates skipping five bits and carrying out the small signal conversion over a remaining nine bits, it is envisaged that in other examples a different number of bits may be skipped and or used for the conversion process. Also, in other examples, an ADC may operate over a different dynamic range (and therefore number of bits). In this example, the first four MSB DAC sources may be pre-set for a small sampled signal or skipped. Thus, the first four conversion steps (i.e. MSB to MSB−3) can be skipped (after the detection of a small signal sample that is able to result in the searching range being narrowed down). In this example, the nine least significant bit (LSB) outputs 528 appear as the first nine output bits 536 during the (new) conversion phase sequence 530. Here, the SAR ADC, such as SAR ADC 400 from FIG. 4, is able to still find the same value as the output digital representation of the sampled signal, as the small signal representation will be the same.

In essence, when an SAR ADC is performing a binary search in a conversion phase, it takes 'N' conversion steps to finish the search (the example shown in FIG. 5 is a 14-bit SAR ADC, that would ordinarily require 14 conversion steps and each conversion step outputs a decision bit d[13:0]). In accordance with some examples of the invention, the first few DAC sources may be switched (or pre-set) at the beginning of a conversion phase, which yields additional conversion cycles (such as the remaining five bits 534) at the end of the new conversion phase sequence 530.

These additional conversion cycles may be used for any suitable purpose. In contrast, example of the invention may provide additional conversion cycles for use, say, repeating the last decisions and average them for noise reduction (e.g. 4 extra conversion cycles provides 6 dB suppression of the ADC thermal noise) in order to enhance the SNR performance of the SAR ADC. In one example, the ADC extra conversion cycles may be exploited for background calibration of the offset of the comparator.

Referring now to FIG. 6, an example flowchart 600 of an improved SAR ADC is illustrated, according to example embodiments of the invention. The example flowchart 600 of the SAR ADC starts at 602, and a sample phase starts at 604. In the tracking phase, an analog input signal is tracked and its voltage value provided to a track and hold circuit (T/H). At 606, the T/H circuit stops the tracking phase and holds the signal value (Vsample). In accordance with examples of the invention, a range detector (RD), e.g. signal level range detector circuit 470 of FIG. 4, determines whether |Vsample|<Vth at 608. If the determination at 608 is that |Vsample|≥Vth, then the flowchart moves to 610 and a normal successive approximation conversion phase, operating from step one to the N-th step, is commenced. At 612, the outputs of the RD and SAR controller output bits are combined in the same conversion phase, and the digital output bits mapped into, say, a predefined form.

However, if the determination at 608 is that |Vsample|<Vth, then the flowchart moves to 614, where the first 'M' conversion steps are skipped and a first 'M' DAC cells (MSB to MSB−M+1) set in a balanced mode. Thereafter, the conversion phase from the N-M step starts until the N-th step. At 612, the outputs of the RD and the SAR controller (modified) output bits are combined in the same conversion phase, and the digital output bits mapped into, say, a predefined form.

At 616, a determination is made as to whether the SAR ADC operation is completed, and if it has the flowchart ends at 618. If the operation of the ADC is not stopped, then the flowchart loops back to 604.

Figure 7:
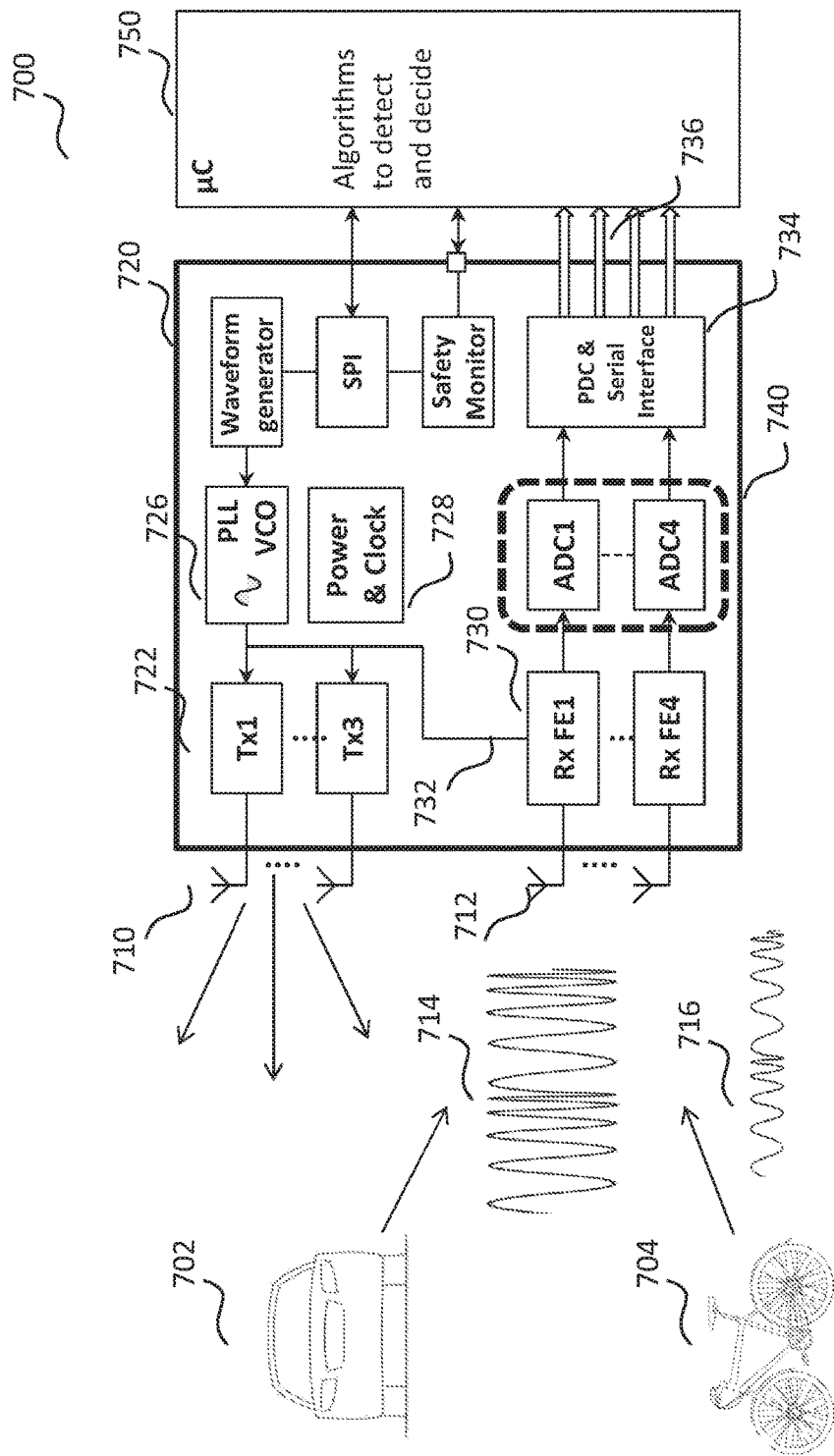
FIG. 7 illustrates a further example block diagram of a radar unit configured to identify between large echo signals and small echo signals, according to example embodiments of the invention.

Referring now to FIG. 7, a block diagram illustrates a FMCW radar unit 700, adapted according to examples of the invention. The FMCW radar unit 700 includes one or more transmitter antenna(e) 710 and one or more receiver antenna (e) 712 coupled to radio frequency (RF)/transceiver and synchronisation circuits 720 signal processing circuits. The RF/transceiver and synchronisation circuits 720 are connected to a microprocessor IC 750 that processes the radar signals. In some examples, the radar functions may operate with multiple separate ICs include. In a transmitter sense, the microprocessor IC 750 includes a digital control and signal processing unit that provides a control signal to a waveform generator via a serial to parallel interface (SPI). The waveform generator provides a signal to control a phase locked loop (PLL) that includes a voltage controlled oscillator (VCO) circuit 726 to output a high frequency modulated signal 732. The high frequency modulated signal 732 is then optionally passed to a frequency multiplier (if the VCO generated signal is not at the operating frequency of the FMCW radar unit). The high-frequency output of the PLL VCO 726 (or the frequency multiplier) is passed to one or more respective amplifiers and power amplifiers 722, where it is amplified and routed to the one or more transmitter antenna(e) 710.

In this example, two radar signals are received from objects of a vehicle 702 and a bicycle 704 at the one or more receiver antenna(e) 712. As shown, the echo signal from the vehicle 702 is much larger, in this example, than the echo signal from the bicycle 704. The received radar signals are passed to one or more receiver circuits 730 that include a low noise amplifier (LNA) where it is amplified, passed to a down-mixer, where it is mixed with high frequency modulated signal 732 output from the PLL VCO 726. The down-converted received radar signal is input to a programmable baseband circuit that includes a bandpass filter and one or more gain amplifiers, as well as an SAR ADC 740 adapted according to examples of the invention. The digital output from the SAR ADC 740 is input 736, via a PDC and serial interface 734, to a digital control and signal processing unit in microprocessor IC 750 for processing. Although an FMCW radar unit is illustrated in this example, it is envisaged that other modulation formats employed by radar units may be employed, such as pulse mode, ultra-wide bandwidth (UWB), etc.

Figure 8:
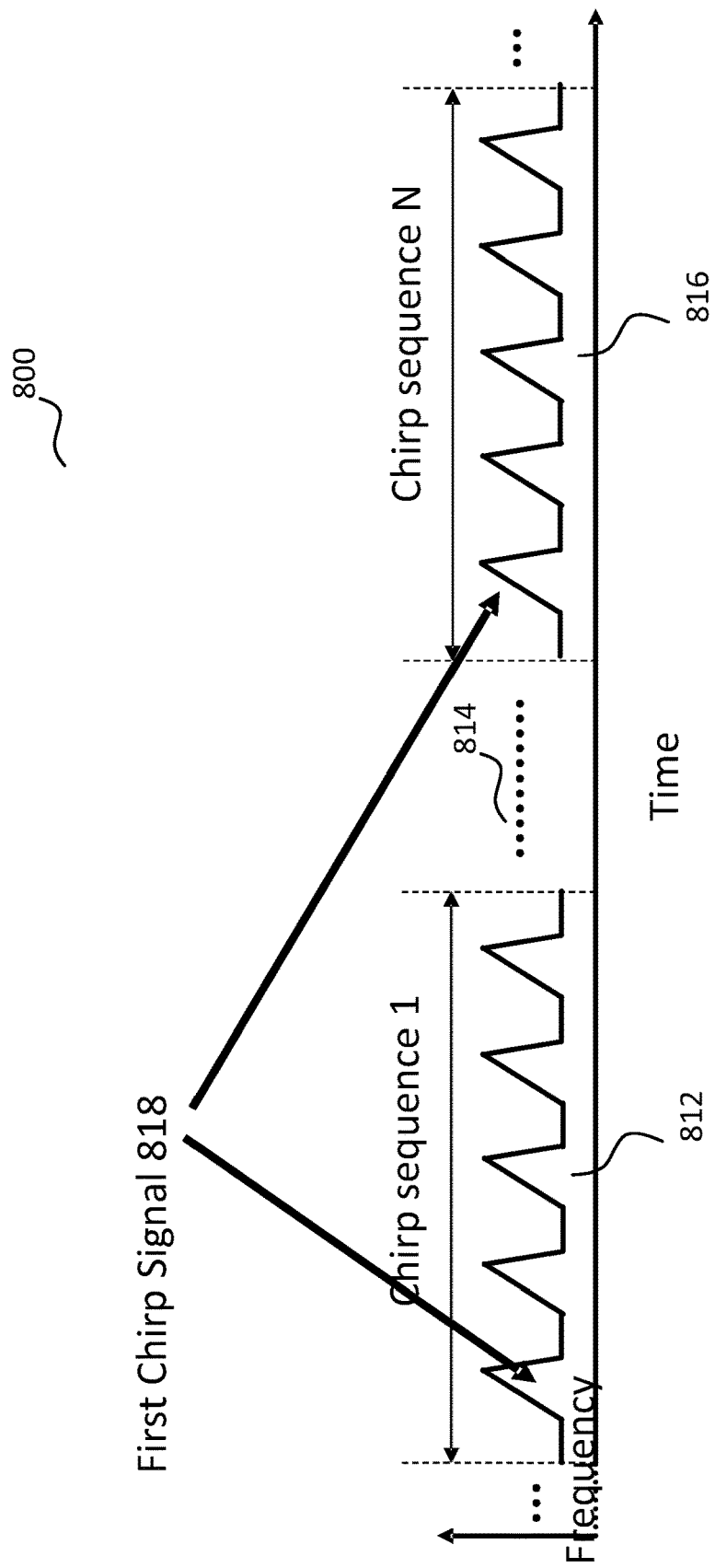
FIG. 8 illustrates a chirp sequence example that can be used in the radar unit of FIG. 7, according to example embodiments of the invention.

Referring now to FIG. 8, an example of a sequence of chirps in one measurement cycle, which can be used in the radar unit of FIG. 7 is illustrated, according to example embodiments of the invention. In the context of automotive radar system, utilizing fast chirps, the range and velocity measurement is based on comparing a sequence of transmitted signals (chirps) 732 with the corresponding reflection signals, such as echo signals 714, 716 in FIG. 7.

Each sequence of chirps 812, 816 can be composed of a large number of chirps (e.g. 64 or more). As the duration of one chirp sequence is short (~10 ms), the relative distance of the targets to the Radar unit can be assumed to be static during this period. Therefore, it is assumed that the reflection signal's strength is constant as well. The first chirp signal 818 in the first and second chirp sequences 812, 816 can be dedicated to be the pilot chirp for estimating the strength of the radar reflection signal. When a small reflection signal is detected in the first chirp sequence 812 (e.g. maximum signal level <-25 dBFS), as processed by the ADC and a digital signal processing circuit, the first few MSB DAC units (e.g. the first 4 or 5) may be set in a balanced position. Thus, in this instance, the SAR ADC skips switching the first few MSB DAC units in its conversion phase during the rest of the measurements in the same chirp sequence, i.e. within first chirp sequence 812 and second chirp sequence 816. In this illustrated example, it is assumed that a signal processing time may be utilised in a latency period 814 between respective chirp sequences. In this case, there is no need to have a dedicated detection circuit (Range detector) as shown in FIG. 4. In this example, the ADC itself is used in this time period (e.g. the duration of the first chirp signal 818) as a detection circuit. Its digital outputs may be processed by a simple digital signal processing unit to obtain a decision of the maximum amplitude level of the input signal.

Figure 9:
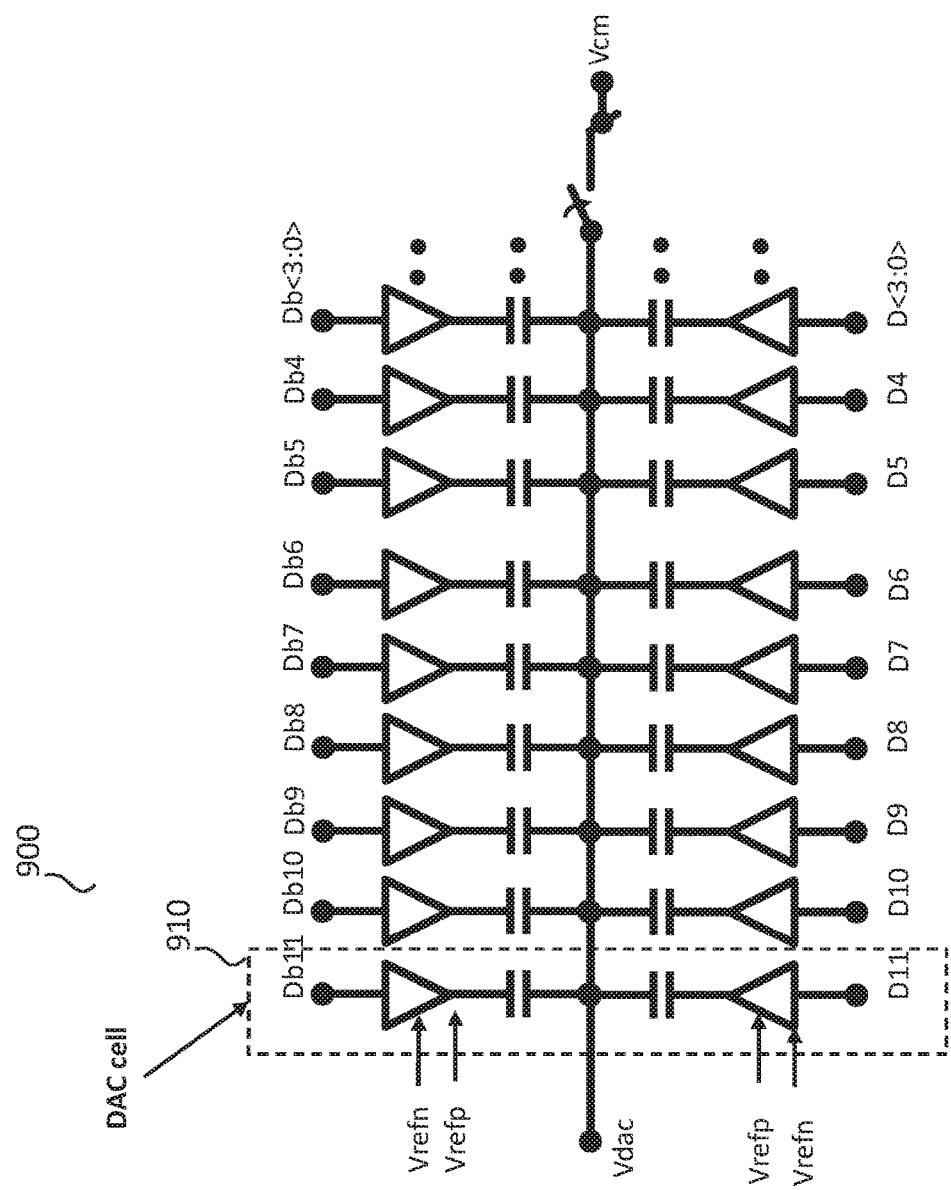
FIG. 9 illustrates an example circuit implementation of a DAC based on a switched capacitor approach, according to some example embodiments of the invention.

As illustrated in FIG. 9, the DAC inside the SAR ADC is controlled by a SAR controller in order to generate an analog signal to compare against the sample signal value during conversion phase.

The DAC may be constructed using switched capacitor type circuits 900 with multiple of weighted capacitive DAC cells 910, for example, as known.

In some examples of the invention, the SAR ADC may be configured such that the SAR controller and the digital output signal exhibits non-binary to binary code mapping, such that the output is able to be adapted according to the number of MSB bits that are pre-set and/or skipped. In this example, a search algorithmic employed in the signal processor of the SAR ADC may not be limited to only binary conversion, but instead may support non-binary conversion (for example scaled by 1.8 times/step, using a known approach). However, when applied with a tri-state (-1, 0, 1) approach, the first couple of MSBs require translation (mapping) into binary data that passed to the digital circuits that follow the ADC.

Figure 10:
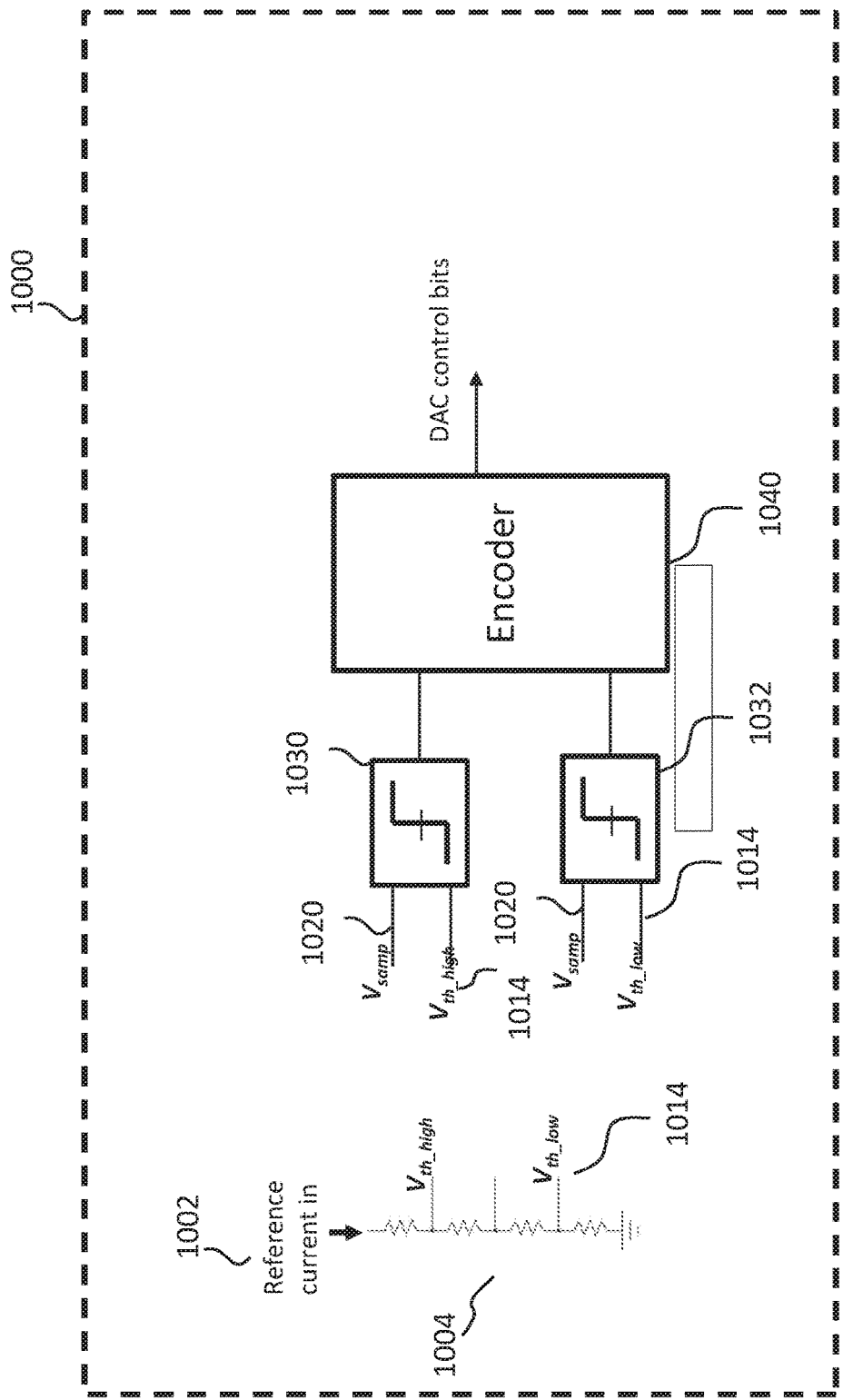
FIG. 10 illustrates an example of a range detection circuit that can be used in a SAR ADC, according to example embodiments of the invention.

One example implementation of a range detection circuit, such as range detection circuit 470 of FIG. 4, is illustrated in FIG. 10. The range detector circuit compares a sampled signal (which in some examples may be the one from the main T/H circuit, or in other examples from its own T/H circuit) against one or more of the reference voltages (e.g. Vth_high, Vth_low) and pass this information to the SAR controller and digital signal reconstruction blocks (e.g. as shown in FIG. 4). In some examples, this passing of information may be configured to happen right after the tracking phase and before start of the conversion of the SAR ADC.

For example, the range detection circuit 1000 implements a determination of a reference current 1002 that includes two threshold levels (-Vth+Vcm 1012 and +Vth+Vcm 1014). Typically, a SAR ADC would have a differential input with input full range VFS between $-\frac{1}{2}$*VFS+Vcm and $+\frac{1}{2}$*VFS+Vcm, where Vcm is a common mode voltage with certain fixed values. In a case of a single ended input, then one threshold is sufficient. In some examples, a resistive ladder network 1004 may be used to implement one, two or more threshold levels, as shown.

In this SAR ADC, an auxiliary range detection path is introduced to compare the sampled amplitude levels against two (although in other examples more thresholds may be used) predefined reference levels, for example using two comparators 1030, 1032 in a first conversion cycle. The predefined reference levels (e.g. thresholds) are generated to compare against the sampled signal value in order to have a rough idea as to a value of the sampled signal value (e.g. whether it is small or large). The comparator outputs are sent to an encoder circuit 1040 that outputs DAC control bits to pre-set the corresponding DAC MSB cells.

In some examples, a range detection circuit can be implemented as a Flash ADC with two detection levels; the detection thresholds can be selected according to the need of the specific system. In some examples, the detection thresholds may be reconfigurable. In some examples, the number of detection levels may be more than two, for example when the number of pre-set MSB bits is made adaptive.

Figure 11:
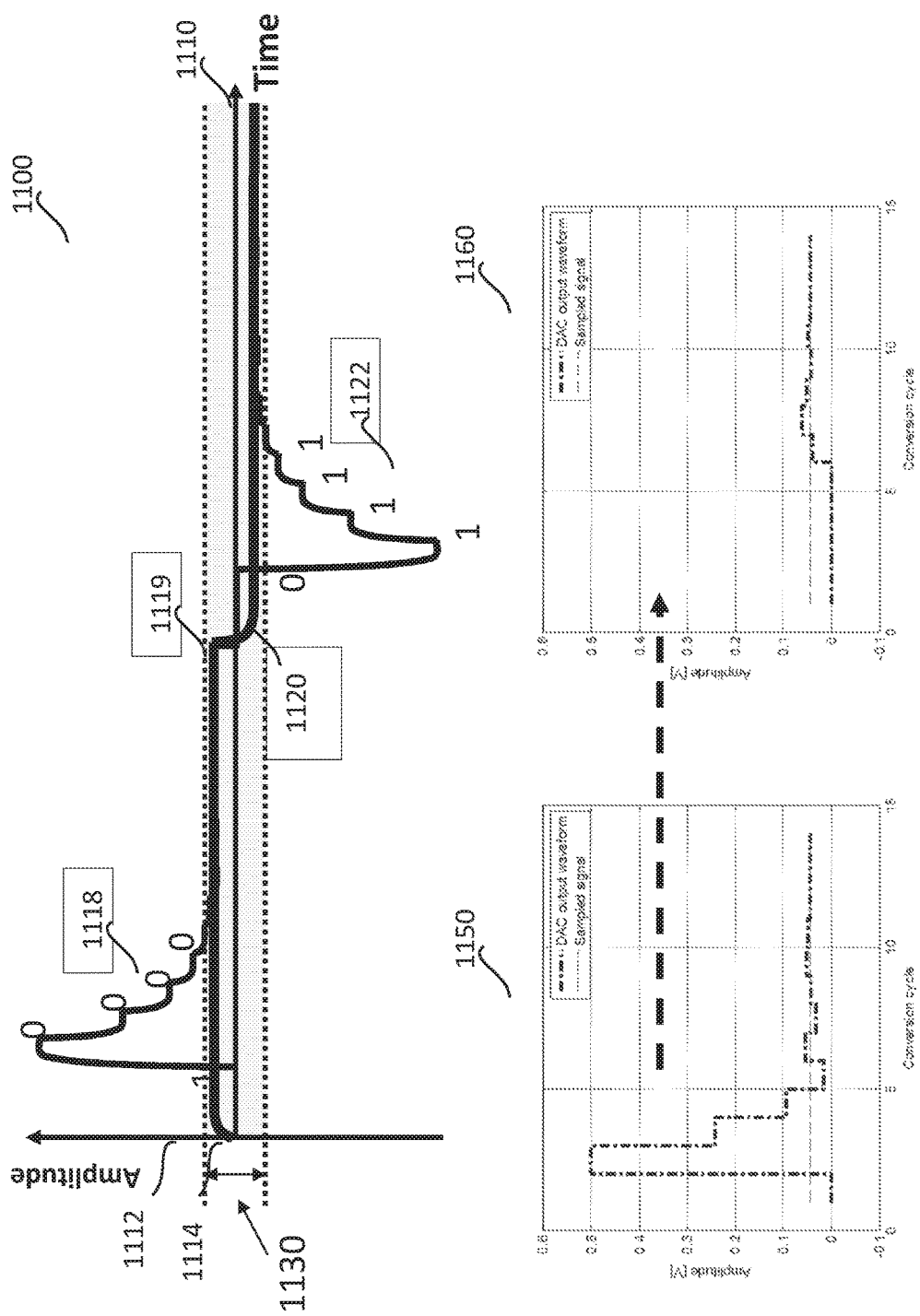
FIG. 11 illustrates an alternative method to detect signal strength, which detects the sampled signal level by monitoring the first few comparator decisions of the SAR ADC in each conversion phase according to example embodiments of the invention.

Referring now to FIG. 11, illustrates an alternative method to detect signal strength, which detects the sampled signal level 1114, 1120 by monitoring the first few comparator decisions of the SAR ADC in each conversion phase, according to example embodiments of the invention. In this example of the invention, such signal strength detection may be achieved in the digital domain, without a need for an additional analog range detection path, such as additional analog range detection path 417 in FIG. 4. At the end of each conversion phase of the sampled signal, the DAC is reset at 1119 and the input signal is again sampled by the T/H circuit. As illustrated, if a first comparator decision in one of the conversion phase has either of these code patterns [1,0,0,0,0] 1118 or [0,1,1,1,1] 1122, then the system may be configured to inherently know that the sampled signal level 1114, 1120 is small enough to be considered as a small signal, i.e. within a range 1130 that is considered as being small signal range. Here, the number '0' or '1' indicates a comparator decision that is passed to the SAR controller and processed in order to generate a digital control signal that controls the DAC to output a signal Vdac that is higher or lower than its previous value.

A first waveform 1150 shows a first sampled input signal and associated DAC output waveform for a conventional SAR ADC conversion sequence in one conversion phase. A second waveform 1160 shows a first sampled input signal and associated DAC output waveform for a SAR ADC with first 4 MSB DAC cells reset for a small sampled signal after detecting the first 4 comparator decisions have pattern of [1, 0, 0, 0] as shown in (a), and in accordance with this example of the invention.

Thus, in this example, the SAR controller may be programmed to implicitly recognise that the ADC is converting a small sampled signal and in response to a small signal being detected, the first few MSB DAC cells can be reset to a balanced state or hold/neutral state for the selected MSBs, and their weights are not then used in the output digital codes mapping.

Figure 12:
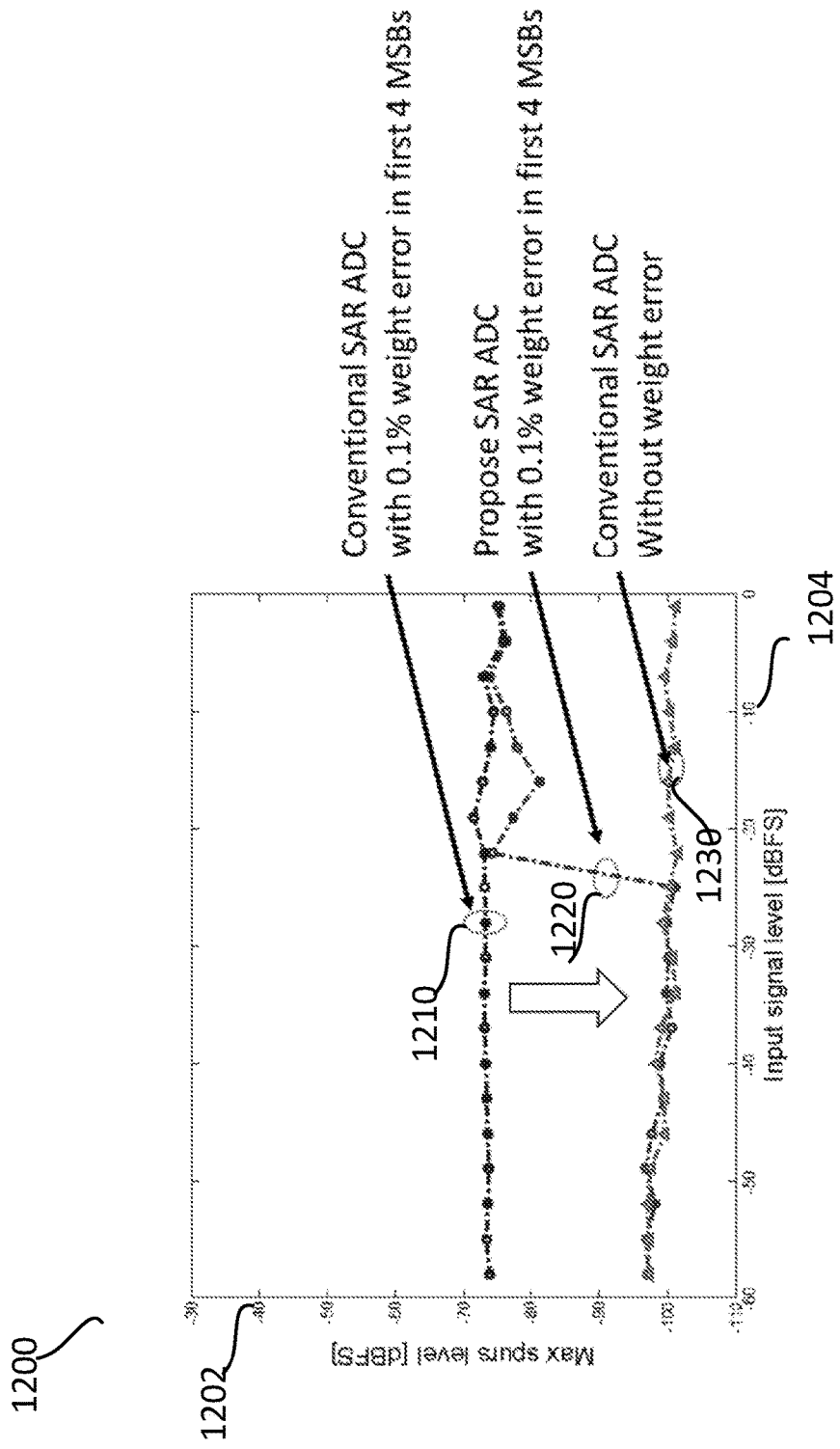
FIG. 12 illustrates a graphical example of a performance improvement of an SAR ADC, according to examples of the invention

FIG. 12 illustrates a graphical example 1200 of a >20 dB performance improvement of an SAR ADC adapted according to examples of the invention, when converting a small level input signal. The graphical example 1200 shows a maximum level of spurs (in dBFS) 1202 versus the input signal level (in dBFS) 1204. A first set of results 1210 shows the performance of a conventional SAR ADC with a 0.1% DAC weight mapping error in the first four MSBs. A second set of results 1220 shows the performance of the SAR ADC according to examples of the invention, again with a 0.1% weight error in the first four MSBs. This second set of results 1220 shows at least 20 dB performance over the convention SAR ADC in the first set of results 1210 for input signal levels of less than −25 dBFS.

A third set of results 1230 shows a performance of a conventional SAR ADC without a DAC weight error, for which the spurs level in this simulation is limited by noise. Hence, the small signal linearity performance of the SAR ADC according to examples of the invention, for an input signal <−25 dBFS, is observed to be similar to an ideal case.

Thus, known SAR ADC calibration techniques, employed in either the foreground or background of ADC conversion, and correction techniques, employed either in analog or digital domains, fail to sufficiently address or mitigate the DAC cell mismatch problem. Their effectiveness depends on the measurement accuracy and the non-idealities of correction devices. These solutions do not address the issue of performance spread due to calibration imperfection and how to deal with the remaining DNL errors that inevitably degrade the ADC small signal linearity.

Examples of the invention, however, propose a different approach to tackle a DAC mismatch issue, with a particular focus on enhancing the ADC small signal linearity. In some examples by using an adaptive conversion technique, the impact of mismatch error of larger DAC cells on small signal linearity can be substantially eliminated. Advantageously, examples of the invention do not degrade the normal conversion speed of the ADC and noise performance.

In some examples of the invention, the use of programmable thresholds enables the SAR ADC to employ an adaptive conversion scheme. In this manner, the SAR ADC may be configured, or reconfigured, say 'on the fly', to be insensitive to mismatches of MSB DAC cells. Alternatively, in some examples, the thresholds employed may be pre-defined values.

Although examples of the invention are described with reference to a radar unit for, say, an automotive safety system, it is envisaged that the concepts herein described may be applicable to other applications, such as radar for robotics or drones.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above. The connections as discussed herein may be any type of connection suitable to transfer signals from or to the respective nodes, units or integrated circuit devices. Accordingly, unless implied or stated otherwise, the connections may for example be direct connections or indirect connections. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the architectures depicted herein are merely exemplary, and that in fact many other architectures can be implemented which achieve the same functionality. Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the circuit and/or component examples may be implemented as any number of separate integrated circuits or separate devices interconnected with each other in a suitable manner. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A radar unit having a successive approximation register, SAR, analog-to-digital converter, ADC, comprises:
   an analog input signal;
   an ADC core configured to receive the analog input signal and comprising:
      a digital to analog converter, DAC located in a feedback path; and
      a SAR controller configured to control an operation of the DAC, wherein the DAC comprises a number of DAC cells, arranged to convert a digital code from the SAR controller to an analog form;
   a digital signal reconstruction circuit configured to convert the digital codes from the SAR controller to a binary form;
   an output coupled to the digital signal reconstruction circuit and configured to provide a digital data output;
   wherein the SAR ADC is characterised by:
      wherein the DAC is configurable to support at least two mapping modes, including a small signal mapping mode of operation; and
      the SAR controller is configured to identify when the received analog signal is a small signal level, and in response thereto re-configure the DAC and the digital signal reconstruction circuit to operate in the small signal mapping mode of operation, the small signal mapping mode of operation being used for at least one of noise reduction and background calibration for the radar unit.

2. The radar unit having the SAR ADC of claim 1 wherein the SAR controller is configured to determine whether the analog input signal is a small signal within a particular range in response to observing an initial plurality of decisions output from the comparator to determine a signal strength of the sampled analog input signal.

3. The radar unit having the SAR ADC of claim 1 wherein the SAR ADC is configured to operate in a time multiplexed manner and the SAR controller is configured to analyse a first chirp in one chirp sequence of a received signal in order to detect a signal strength of the sampled analog input signal and to use this information for converting subsequent chirps.

4. The radar unit having the SAR ADC of claim 1 further comprising an auxiliary signal level detection path that comprises a signal level range detector circuit coupled to a multiplexer and the SAR controller and arranged to determine a signal strength of the sampled analog input signal, and in response thereto inform the SAR controller and the digital signal reconstruction circuit.

5. The radar unit having the SAR ADC of claim 4 wherein the SAR controller is configured to adaptively set one or more threshold(s) applied by the signal level range detector circuit to influence when the small signal mapping mode of operation is adopted by the DAC and the digital signal reconstruction circuit.

6. The radar unit having the SAR ADC of claim 1 wherein the ADC core comprises:
   a multiplexer configured to receive the analog input signal;
   a track and hold (T/H) circuit coupled to an output of the multiplexer and configured to periodically sample the analog input signal; and
   a comparator circuit coupled to the T/H circuit and configured to receive a difference of the sampled analog input signal and the DAC output signal ($V_{sampled} - V_{DAC}$), and compare the difference with one or more threshold levels.

7. The radar unit having the SAR ADC of claim 6 wherein the SAR controller (418) is configured to determine whether the analog input signal is a small signal within a particular range in response to identifying that the output from the comparator (416) exhibits a code pattern for the initial plurality of decisions within a conversion phase of operation of the SAR ADC.

8. The radar unit having the SAR ADC of claim 1 wherein in response to the SAR controller identifying that the received analog signal is a small signal level, the SAR controller configures the DAC to skip a portion of a conversion operation of the sampled analog signal.

9. The radar unit having the SAR ADC of claim 8 wherein the SAR controller configures the DAC to skip a plurality of most significant bit, MSB, DAC cells of the conversion operation in response to a detection of a small received signal level.

10. The radar unit having the SAR ADC of claim 9 wherein the plurality of DAC cells that are skipped comprises the corresponding DAC cells being placed in a balanced or hold mode of a tri-state DAC switching scheme, and whereby corresponding weights stored in a digital domain are not used for output signal reconstruction by the digital signal reconstruction circuit.

11. The radar unit having the SAR ADC of claim 9 wherein the plurality of MSB DAC cells that are skipped occurs when the sampled analog input signal level is below a pre-set threshold level.

12. The radar unit having the SAR ADC of claim 1 wherein the DAC is configured to operate in a switched bit-wise mode of operation such that a digital representation of the analog input signal is provided to the SAR ADC output.

13. A radar unit comprises a baseband circuit having a successive approximation register, SAR, analog-to-digital converter, ADC, that comprises:
  an analog input signal;
  an ADC core configured to receive the analog input signal and comprising:
    a digital to analog converter, DAC located in a feedback path; and
    a SAR controller configured to control an operation of the DAC, wherein the DAC comprises a number of DAC cells, arranged to convert a digital code from the SAR controller to an analog form;
  a digital signal reconstruction circuit configured to convert the digital codes from the SAR controller to a binary form;
  an output coupled to the digital signal reconstruction circuit and configured to provide a digital data output;
  wherein:
    the DAC is configurable to support at least two mapping modes, including a small signal mapping mode of operation; and
    the SAR controller is configured to identify when the received analog signal is a small signal level, and in response thereto re-configure the DAC and the digital signal reconstruction circuit to operate in the small signal mapping mode of operation, the small signal mapping mode of operation being used for at least one of noise reduction and background calibration for the radar unit.

14. The radar unit of claim 13 wherein the electronic device is a radar unit comprising at least one antenna coupled to at least one radio frequency circuit configured to receive and down-convert received radar signals, wherein the radar unit comprises a baseband circuit having the SAR ADC.

15. A method for digitizing a received analog signal to an output digital form in a successive approximation register, SAR, analog-to-digital converter, ADC, of a radar unit wherein the method comprises:
  receiving and sampling an analog input signal;
  controlling, by an SAR controller, an operation of a digital to analog converter, DAC, located in a feedback path of the SAR ADC and comprising a number of DAC cells;
  converting by the DAC a digital code from the SAR controller to an analog form ($V_{sampled} - V_{DAC}$);
  receiving a difference of the sampled analog input signal and the analog form of the digital code;
  providing a digital data output by a digital signal reconstruction circuit
  wherein the method is characterised by:
  supporting at least two mapping modes by the DAC, including a small signal mapping mode of operation; and
  identifying when the received analog input signal is a small signal level, and in response thereto re-configuring the DAC and the digital signal reconstruction circuit to operate in the small signal mapping mode of operation, the small signal mapping mode of operation being used for at least one of noise reduction and background calibration for the radar unit.

16. The method of claim 15, further comprising determining whether the analog input signal is a small signal within a particular range to determine a signal strength of the sampled analog input signal.

17. The method of claim 15, further comprising analyzing a first chirp in one chirp sequence of a received signal in order to detect a signal strength of the sampled analog input signal and using the detected signal strength for converting subsequent chirps.

18. The method of claim 15, further comprising determining a signal strength of the sampled analog input signal, and in response thereto informing the SAR controller and the digital signal reconstruction circuit.

19. The method of claim 15, further comprising identifying, by the SAR controller, that the received analog signal is a small signal level, and in response thereto configuring the DAC to skip a portion of a conversion operation of the sampled analog signal.

20. The method of claim 15, further comprising operating the DAC in a switched bit-wise mode of operation such that a digital representation of the analog input signal is provided to the SAR ADC output.

* * * * *